(12) United States Patent
Tsironis

(10) Patent No.: US 11,119,140 B1
(45) Date of Patent: Sep. 14, 2021

(54) IMPEDANCE PATTERN GENERATION FOR NOISE PARAMETER MEASUREMENT SYSTEM

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 191 days.

(21) Appl. No.: 16/118,766

(22) Filed: Aug. 31, 2018

Related U.S. Application Data

(60) Provisional application No. 62/552,736, filed on Aug. 31, 2017.

(51) Int. Cl.
  *G01R 29/26* (2006.01)
  *G01R 27/28* (2006.01)

(52) U.S. Cl.
  CPC ............ *G01R 29/26* (2013.01); *G01R 27/28* (2013.01)

(58) Field of Classification Search
  None
  See application file for complete search history.

(56) References Cited

U.S. PATENT DOCUMENTS

| | | | | |
|---|---|---|---|---|
| 4,864,218 A * | 9/1989 | Leake | ............. | G01R 29/26 324/613 |
| 4,998,071 A * | 3/1991 | Strid | ............. | G01R 29/26 324/612 |
| 5,068,615 A * | 11/1991 | Strid | ............. | G01R 29/26 324/612 |
| 5,276,411 A | 1/1994 | Woodin et al. | | |
| 5,416,422 A * | 5/1995 | Dildine | ............. | G01R 29/26 324/613 |
| 6,114,858 A * | 9/2000 | Kasten | ............. | G01R 29/26 324/616 |
| 8,212,629 B1 * | 7/2012 | Tsironis | ............. | H03H 7/20 333/17.3 |
| 8,461,946 B1 * | 6/2013 | Tsironis | ............. | G01R 1/26 333/263 |

(Continued)

OTHER PUBLICATIONS

H.Rothe and W.Dahlke, "Theory of noisy four poles", Proceedings of the IRE, Jun. 1956, pp. 811-818.

(Continued)

*Primary Examiner* — Lina M Cordero

(57) ABSTRACT

A fast wideband four noise parameter measurement and extraction method uses randomly distributed source impedance states, which are generated using wideband electromechanical tuners, and noise figure data collected in fast frequency sweeps; because of the random nature of source impedances reliable noise parameter values are extracted using selected source admittance states generated by sweeping the frequency by small amounts around a set of center frequencies instead of moving the tuner probe, hereby using the natural tuner phase rotation instead of a (time consuming) mechanical tuner sweep at a fixed center frequency. The core of the method is swapping slow tuner mechanical sweep with fast frequency sweeps, allowed since the 4 noise parameters are benign frequency functions. Multiple noise parameter extractions for all possible cross-combinations of the source impedance states at each measured frequency allows reliable and physically meaningful generation of wideband noise parameters, even for very low noise and potentially unstable DUT's.

5 Claims, 7 Drawing Sheets

(56) References Cited

U.S. PATENT DOCUMENTS

| | | | |
|---|---|---|---|
| 8,786,293 B1 | 7/2014 | Tsironis | |
| 8,892,380 B2* | 11/2014 | Simpson | G01R 29/26 702/69 |
| 9,336,710 B2 | 5/2016 | Ryu et al. | |
| 9,431,999 B1* | 8/2016 | Tsironis | H03J 1/06 |
| 9,712,134 B2* | 7/2017 | Dudkiewicz | H03H 7/40 |
| 9,866,203 B1 | 1/2018 | Tsironis | |
| 10,317,449 B2* | 6/2019 | Himmelfarb | G01R 29/26 |
| 2003/0080724 A1* | 5/2003 | Mar | G01R 29/26 324/76.52 |
| 2009/0275301 A1* | 11/2009 | Brueckler | H04B 17/20 455/226.3 |
| 2010/0030504 A1* | 2/2010 | Simpson | G01R 29/26 702/69 |
| 2011/0025296 A1* | 2/2011 | Benedikt | G01R 31/2837 324/76.19 |
| 2014/0081586 A1* | 3/2014 | Boglione | G01R 29/26 702/69 |
| 2016/0124032 A1* | 5/2016 | Simpson | G01R 29/26 702/69 |

OTHER PUBLICATIONS

"Friis formulas for noise", [online], Wikipedia [retrieved on Jul. 13, 2016]. Retrieved from Internet <URL: http://en.wikipedia.org/wiki/Friis_formulas_for_noise>.

Sischka, Franz, "Basics of S-parameters, part 1", Characterization handbook, Mar. 2002.

M. Sannino, "On the determination of Device Noise and Gain Parameters", Proceedings IEEE, vol. 67, pp. 1364-1382, Sep. 1979.

R. Lane, "The determination of Device Noise Parameters", Proceedings IEEE, vol. 57, pp. 1461-1462, Aug. 1969.

"Singular Value Decomposition", [online], Wikipedia, [retrieved on Aug. 31, 2017]. Retrieved from Internet <URL:http://en.wikipedia.org/wiki/Singular_value_decomposition>.

* cited by examiner

IMPEDANCE PATTERN GENERATION FOR NOISE PARAMETER MEASUREMENT SYSTEM

PRIORITY CLAIM

This application claims priority on provisional application No. 62/552,736, filed on Aug. 31, 2017, titled: "Fast Noise Parameter Measurement System".

CROSS-REFERENCE TO RELATED ARTICLES

1. H. ROTHE and W. DAHLKE, "Theory of noisy four poles", Proceedings of the IRE, June 1956, pages 811-818.
2. "Friis formulas for noise", [online], Wikipedia [retrieved on 2016-07-13]. Retrieved from Internet <URL:http://en.wikipedia.org/wiki/Friis_formulas_for_noise>.
3. SISCHKA, Franz, "Basics of S-parameters, part 1", Characterization handbook, March 2002.
4. TSIRONIS. C. U.S. Pat. No. 8,786,293, "Noise Parameter Measurement System and Method".
5. M. SANNINO, "On the determination of Device Noise and Gain Parameters", Proceedings IEEE, vol. 67, pages 1364-1382, September 1979.
6. R. LANE, "The determination of Device Noise Parameters", Proceedings IEEE, vol. 57, pages 1461-1462, August 1969.
7. "Singular Value Decomposition", [online], Wikipedia, [retrieved on 2017-08-31]. Retrieved from Internet <URL:http://en.wikipedia.org/wiki/Singular_value_decomposition>.
8. Tsironis, C. U.S. Pat. No. 9,866,203, "High reliability power tuners", FIG. 6.
9. Tsironis, C. U.S. Pat. No. 9,336,710, "Noise Parameter extraction method", FIG. 4.
10. Woodin, C. et al, U.S. Pat. No. 5,276,411, "High Power Solid State programmable load".

BACKGROUND OF THE INVENTION AND PRIOR ART

This invention relates to testing and characterization of low noise microwave and RF transistors and amplifiers (device under test, DUT); the method disclosed comprises a new noise measurement and data processing method for extracting the "four noise parameters" of the DUT applied on a prior art test setup. The typical test setup is shown in FIG. 1; it uses remotely controlled wideband microwave impedance/admittance slide screw tuners in order to synthesize source reflection factors Γs (or admittances Ys) at the input of the DUT and allow collecting the necessary noise power data using appropriate high sensitivity receivers.

All RF two-ports containing semiconductor devices (DUT) contain internal noise sources which affect the purity of the signal entering at the input port and exiting (amplified) at the output port. A common way of characterizing the "purity" of said DUT at each frequency and bias conditions is the "noise figure: F". The noise figure is defined as the degradation of the signal purity or "signal to noise ratio S/N" between the input and output ports of the DUT: F=(S.in/N.in)/(S.out/N.out) (eq. 1). Since the DUT adds to the transmitted signal its internal noise, the S/N ratio at the input is higher than at the output, therefore F>1.

It has been established (see ref. 1) that four real numbers fully describe the noise behavior of any noisy (passive or active) two-port; these are the four noise parameters. By generally accepted convention the four noise parameters (4NP) are: Minimum Noise FIG. (Fmin), Equivalent Noise Resistance (Rn) and Optimum Noise Admittance (Yopt=Gopt+j*Bopt) (see ref. 4) or reflection factor Γopt=|Γopt|exp(jΦopt). The noise figure of a two-port only depends on the admittance Ys of the source and not of the load.

The general relationship is: F(Ys)=Fmin+Rn/Re(Ys)*|Ys−Yopt|$^2$ (eq. 2), whereby Ys=Re(Ys)+jIm(Ys)=Gs+jBs.

F(Ys) in eq. (2) being the noise figure of the whole chain including the DUT and the receiver, the relationship introduced by FRIIS (see ref. 2) is used to extract the noise figure of the DUT itself: FRIIS' formula is: F.dut=F.total−(F.rec−1)/Gav.dut (eq. 3); hereby F.dut is the noise figure of the DUT, F.total is the noise figure of the chain DUT and receiver, F.rec is the noise figure of the receiver and Gav.dut is the available Gain of the DUT for the given frequency and bias conditions. F.rec and Gav.dut depend both, on the S-parameters of the DUT and the source admittance Ys (eq. 2), because the output admittance of the DUT, which is the source admittance of the receiver, depends on Ys (see ref. 3). In terms of reflection factor:

$$\Gamma.\text{out.dut}=S22.\text{dut}+(S12.\text{dut}*S21.\text{dut}*\Gamma s)/(1-\Gamma s*S11.\text{dut}) \quad (\text{eq.3});$$

or $F.\text{rec}=F.\text{rec}(\Gamma.\text{out.dut})=F.\text{rec}(64s)$.

The basic, prior art, test setup is shown in FIG. 1. It comprises a calibrated noise source, a slide screw impedance tuner, a test fixture which holds the device under test (DUT) and a sensitive noise receiver. As mentioned before, scattering (s-) parameters of the DUT are required in order to extract the DUT noise figure from the measured total noise figure using the gain of the DUT, which gain is calculated from the s-parameters and the source reflection factor Γs (see ref. 3). To measure s-parameters a vector network analyzer (VNA) is required and two remotely controlled SPDT (single pole double throw) RF switches are used to toggle (switch) between s-parameter (S) and noise (N) measurement paths (FIG. 1). The tuner, the VNA and the noise receiver are controlled by a system computer, which configures the tuner into generating the source admittance Ys (or the equivalent reflection factor Γs) and digitally retrieves the associated noise measurement data from the noise receiver. Some recent VNAs can also be used as fast noise receivers using a third port thus replacing the noise receiver; however this does not change the concept and principle of the invention. After termination of the measurement session the computer program processes the measured data and extracts the four noise parameters of the DUT for a given frequency and DUT bias conditions. At least 4 values for Γs are required to extract the 4 noise parameters, but in general there have been between 7 and 11 Γs values used, in order to cancel out and compensate for random fluctuations and measurement errors.

BRIEF DESCRIPTION OF THE INVENTION

All prior art techniques (see ref. 5) using mechanical tuners suffer from the fact that such tuners are slow: mechanical probe movement, especially horizontal movement, required to change the phase of the reflection factor, is slow, it can take, depending on the center frequency, several seconds (up to 15 seconds, depending on the measurement frequency: the lower the frequency, the longer it takes) per impedance point, whereas a few vertical steps are enough to change the amplitude of the reflection factor significantly (see FIG. 6 and ref. 8). This invention discloses a noise parameter measurement method, which takes advantage of two facts: (a) the tuner reflection factor rotates relatively fast with frequency due to long transmission lines, and (b) the noise parameters of intrinsic transistors, i.e. excluding matching and resonant circuits, have smooth and low gradient dependence on frequency (see FIG. 5). Therefore, the required change in phase of the source reflection factor Γs can be created by slightly changing the frequency around a center frequency while assuming that in this narrow frequency band the noise parameters are constant. Or, the method consists in measuring noise figure at a center frequency FREQ.J, which varies from 1 to 26 GHz and a number 2N of frequencies around FREQ.J (J=1, 2, 3 . . . , i.e. a total of 2N+1 points) at intervals δF (up to ±5 or ±10 δF, δF being in the low MHz range) and assume that, in this narrow frequency band (FREQ.J-N*δF≤FREQ≤FREQ.J+N*δF) the noise parameters are constant (FIGS. 5 and 7) whereas the source reflection factor rotates. This allows collecting enough data points to extract the noise parameters without moving the tuning probe horizontally. The only tuner movement required is a single vertical tuning probe movement of a few motor steps required to create two concentric circles (TUNER STATE T1 and TUNER STATE T2 in FIG. 4), which takes, typically, a small fraction of one second, at motor rotation speed of 200 steps/second (see also FIG. 5).

DESCRIPTION OF THE DRAWINGS

The invention and its mode of operation will be more clearly understood from the following detailed description when read with the appended drawings in which.

DETAILED DESCRIPTION OF THE INVENTION

Figure 1:
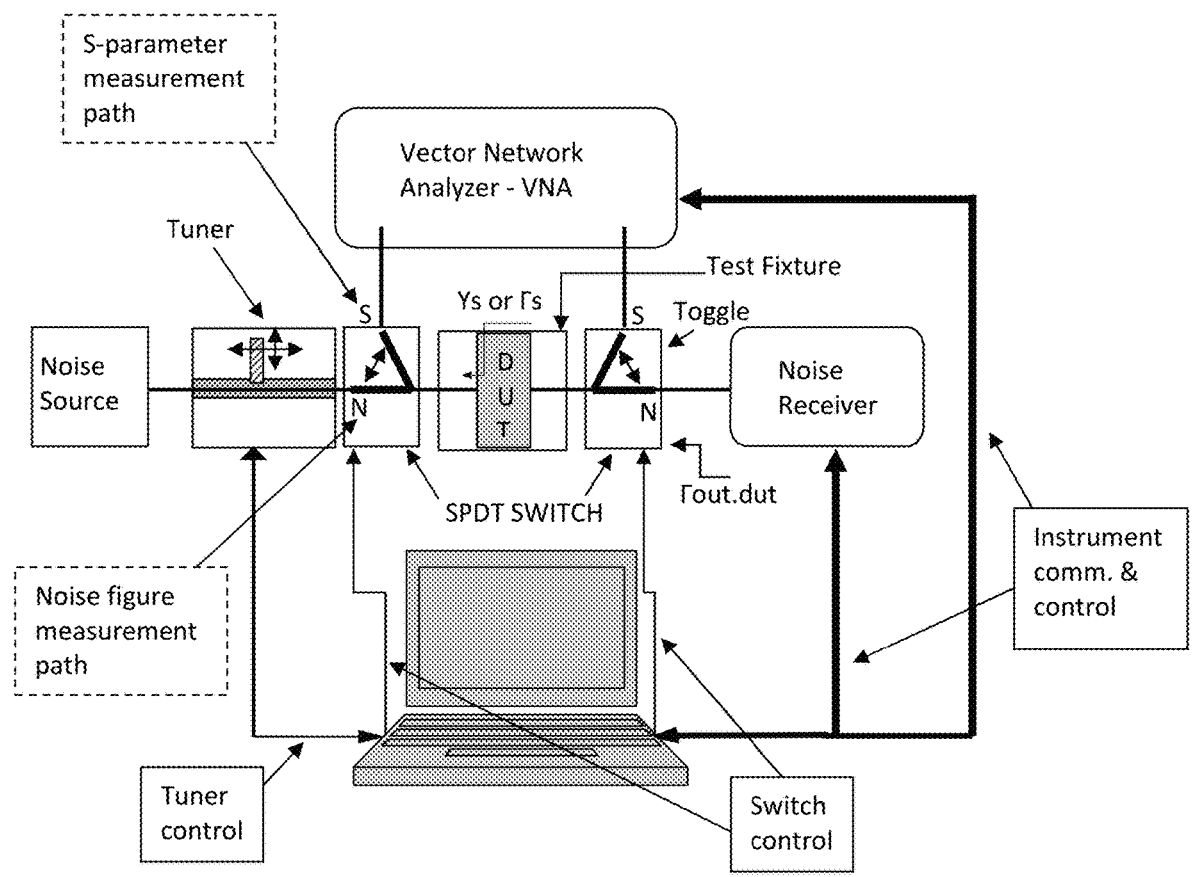
FIG. 1 depicts prior art, the basic configuration of noise parameter measurement system.
Figure 2:
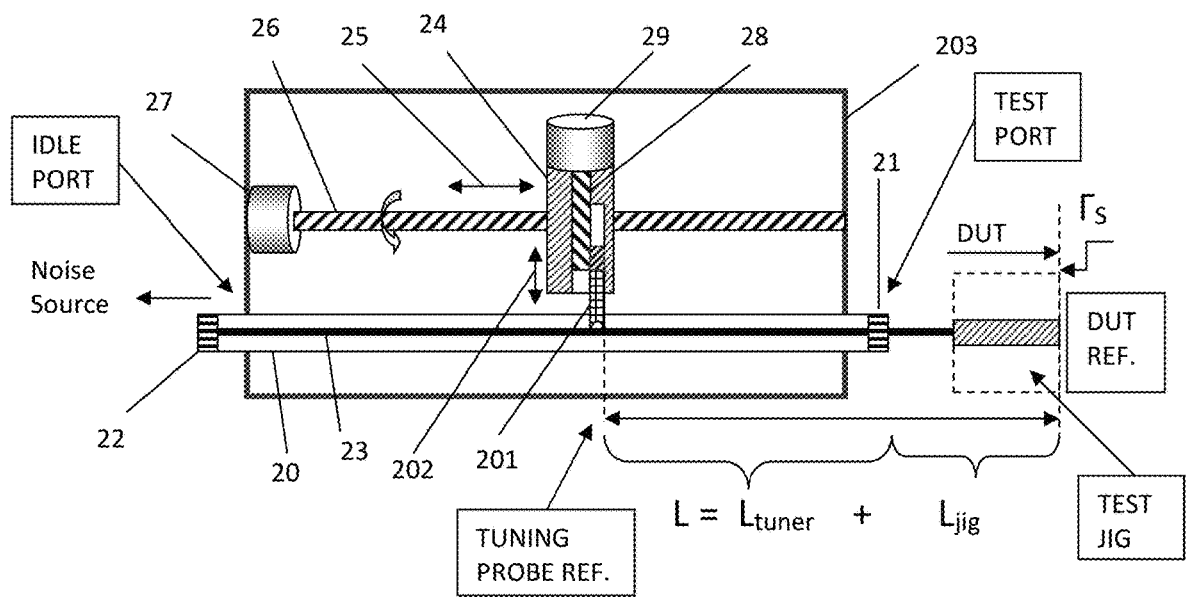
FIG. 2 depicts prior art, the structure and relevant dimensions of a slide screw tuner and DUT configuration.

FIG. 2 shows the typical structure of an automated slide screw impedance tuner. It comprises a slotted airline (slabline) (20) with an output (test) port (21), an input (idle) port (22) and a center conductor (23). A mobile carriage (24) is driven horizontally (25) by a lead screw (26) driven by a stepper motor (27). The carriage (24) comprises a vertical axis (28), which is controlled by a vertical stepper motor (29) and holds a reflective probe (201), capacitively coupled with the center conductor (23) and movable vertically (202), the whole mounted inside a solid housing (203). The electrical distance L between the tuning probe and the DUT comprising the segment inside the tuner ($L_{tuner}$) and the segment between the test port (21) and the DUT ($L_{jig}$) is the core and the critical parameter of the method, allowing, if properly selected, efficient noise parameter extraction with minimum mechanical tuner movement.

Figure 6:
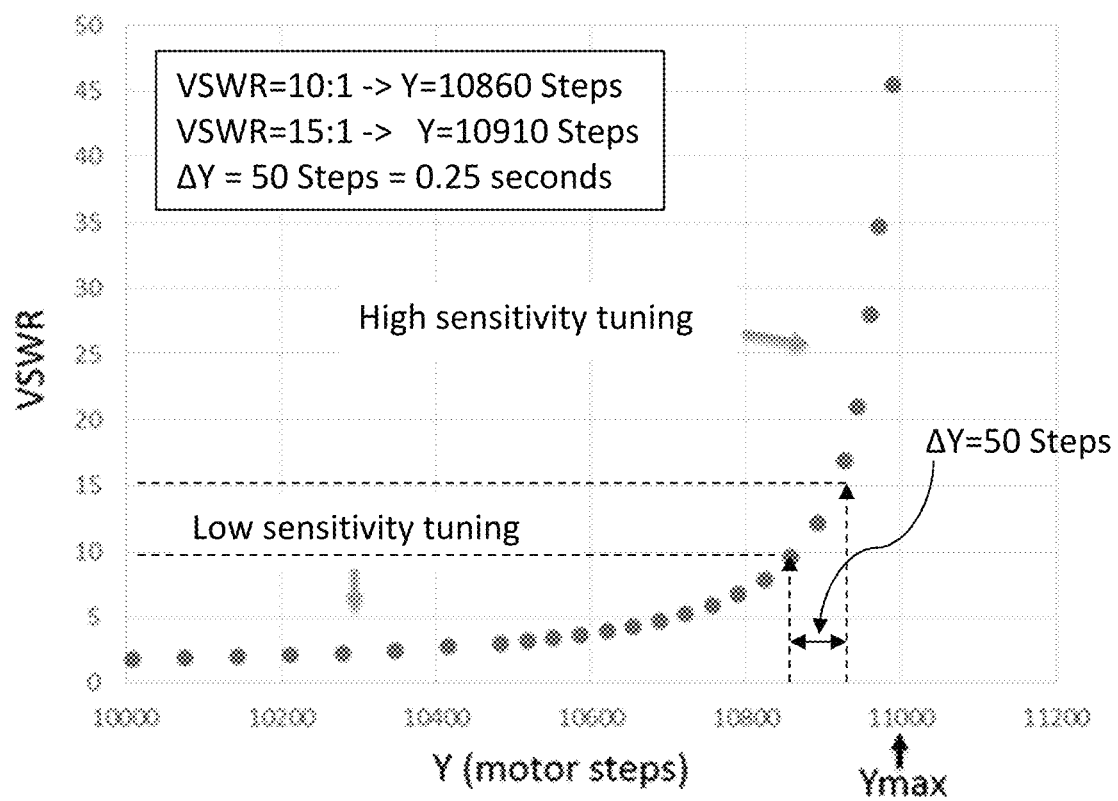
FIG. 6 depicts prior art, reflection factor (or VSWR) of slide screw tuner as a function of probe penetration (in motor steps, 1 step=1.5 micrometer).

The distance between the concave bottom of the probe (201) and the center conductor (23) determines the reflection factor of the tuner at the test port (21). This is shown in FIG. 6. It is shown that at medium to high reflection factors (VSWR between 10:1 and 15:1) the vertical movement required is only 50 motor steps, corresponding to about 75 micrometers. For this movement the stepper motor, which rotates at a speed of 200 steps per second, will require only 0.25 seconds. The aim of this invention is to configure the system such that for the whole measurement session this will be the only required tuner movement.

Figure 4:
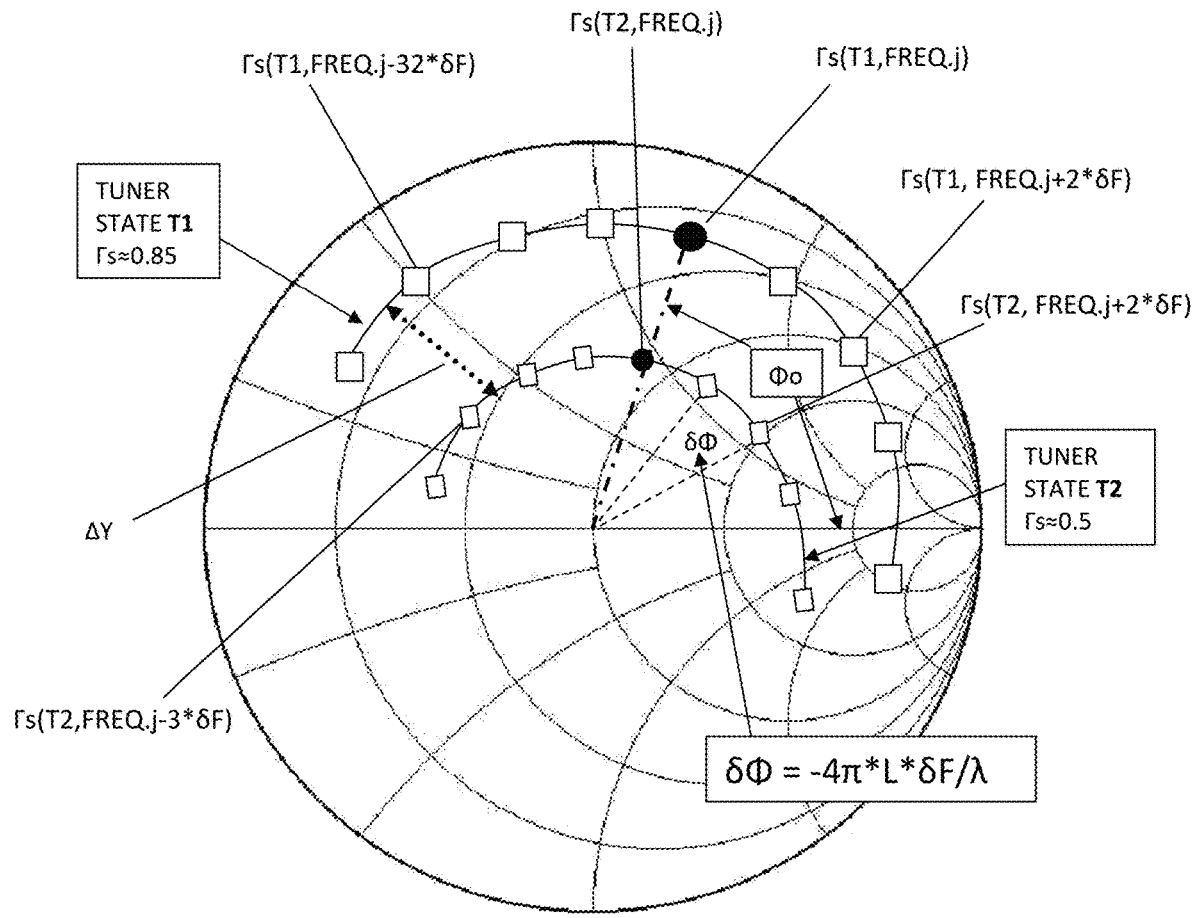
FIG. 4 depicts reflection factors of the slide screw tuner at DUT reference plane as a function of frequency at the same horizontal and two vertical tuning probe settings.
Figure 5:
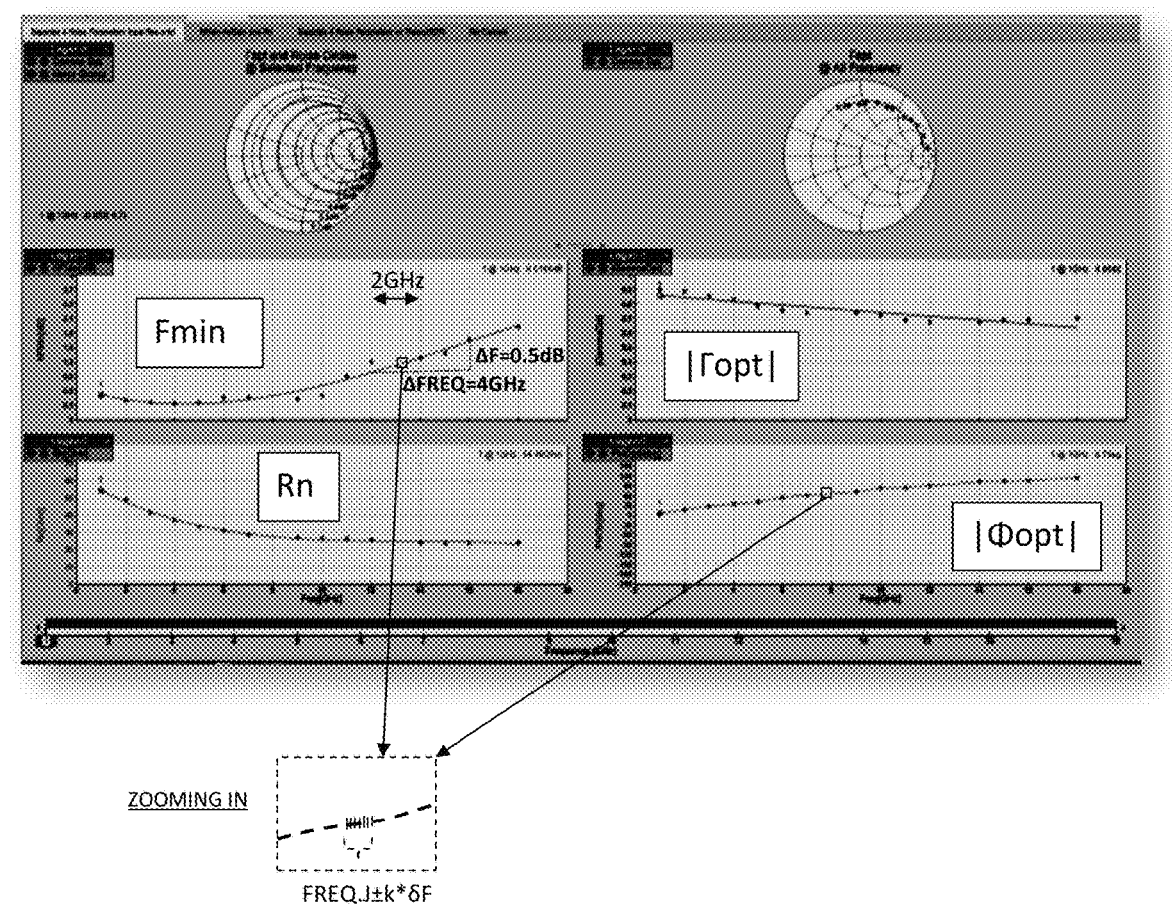
FIG. 5 depicts prior art, typical noise parameters of a chip transistor as a function of frequency, and zoom-in around a center frequency.

For the wideband measurements to be able to execute efficiently and with a high degree of probability to find solutions to the task of noise parameter determination, the approximate phase Φo (FIG. 4) must return for each FREQ.J; the total length L (FIG. 2) must be selected such that |2Nπ+o|=4π*L/λ=4π*L/(300/FREQ.J), whereby L is in mm and FREQ.J is in GHz, and N is an integer 0, 1, 2, 3 . . . ; as an example, for ΦΦo=60°=π/3 and FREQ.J=2 GHz, gives L=12.5 mm and for Φo=2π+π/3 gives L=87.5 mm. The final task is, though, to select FREQ.J and L such that Φo(FREQ.J)≈2Nπ+π/3; this, for Φo(N=0)=π/3, leads to L(mm)*FREQ.J(GHz)=150*N+75, whereby L must be chosen once and remain constant and the selection of N gives admissible FREQ.J values FREQ.J(GHz)≈(150*N+75)/L (mm). The following step of creating appropriate phase change δΦ of the reflection factor around Φo at center frequency FREQ.J follows the relation δΦ(°)=-4π*L(mm)/λ*δF=-4π*L(mm)/300*δF(GHz), or, for the previous example of N=1 or L=225 mm, a phase step δΦ of 15° (or 0.262 rad) requires a frequency step of δF=27.8 MHz and for L=375 mm (N=2) a step δF=16.6 MHz; in both cases δF is small enough to allow for the assumption that the noise parameters in the band of a few frequency steps δF around FREQ.J are constant (FIG. 5); as shown in FIG. 5 at its highest gradient the minimum noise figure Fmin increases by 0.5 dB over 4 GHz frequency change, or 0.00125 dB per 10 MHz. The expected change over 100 MHz bandwidth (FREQ.J±5*10 MHz) is <0.0125 dB, in TUNER STATE T1 (FIG. 4), a value well within the measurement accuracy and tolerance of any noise measurement system (hereby we assumed N=5, δF=10 MHz).

Figure 7:
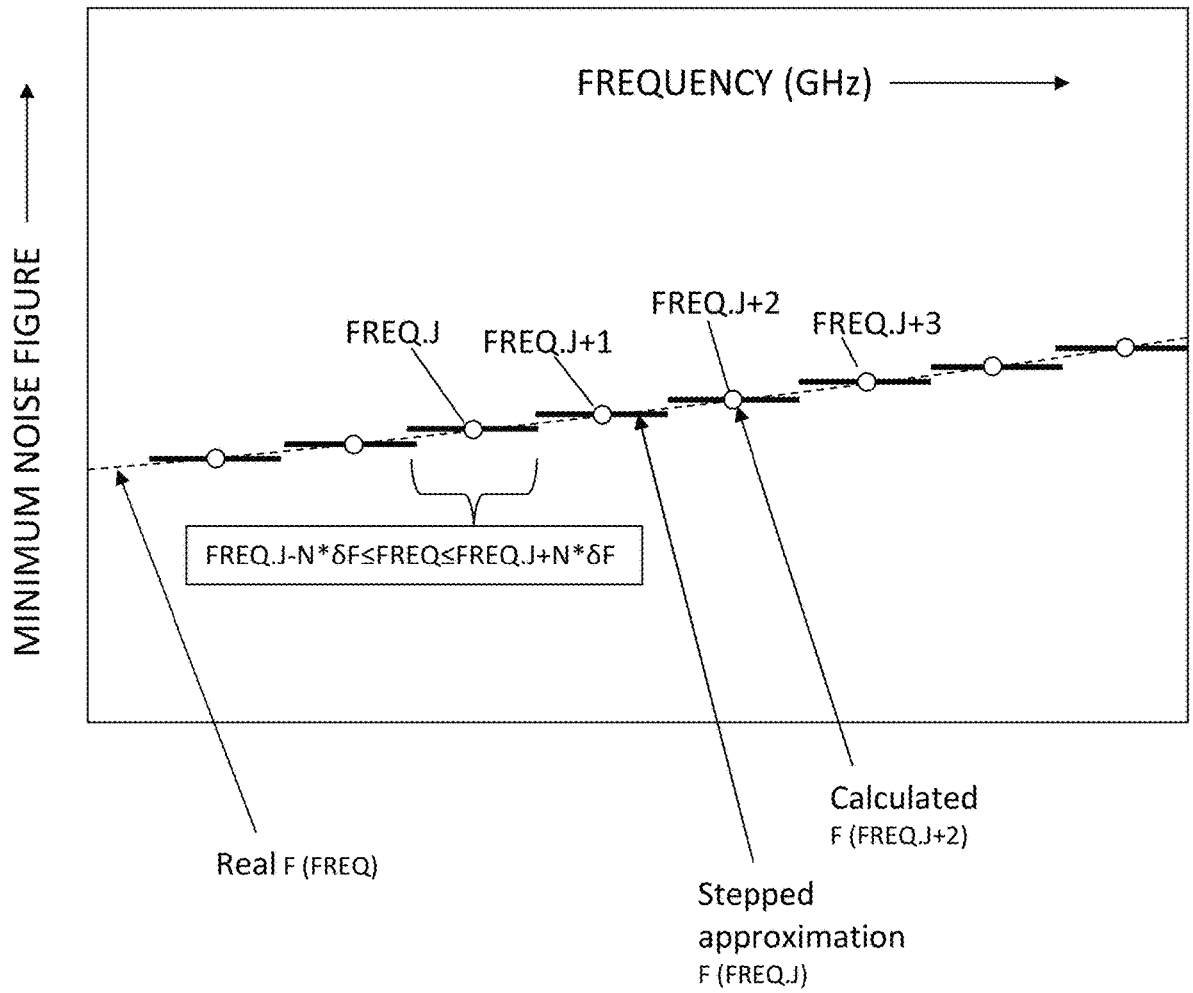
FIG. 7 depicts stepping segmentation of minimum noise figure around center frequencies FREQ.J.

Maybe the unconventional mode of operation needs some further clarification: As the measurement frequency is swept in small steps around a center frequency FREQ for a total band width of 20 to 100 MHz around FREQ, for example for FREQ-50 MHZ in 2N (3≤N≤6) steps up to FREQ+50 MHz, the source reflection factor Γs rotates (FIG. 4). The measured noise figure F(Γs) changes accordingly. However, as the extracted four noise parameters show (FIG. 5) these parameters do not change significantly inside the said bandwidth. Therefore, for the sake of the present extraction, the 4 noise parameters are considered constant. The extraction will yield average values for each band, which will conclude to the correct final data as shown in FIG. 7; i.e. as we process the measured noise figure data F(Γs) we assume the frequency to be constant and the tuner to move, as in prior art, whereas in reality the tuner is fixed and the frequency changes slightly.

All these relations are valid also for the second TUNER STATE T2 (FIG. 4). In practice the optimum position $L_{tuner}$ will be calculated as well as the associated frequencies FREQ.J in order to satisfy approximately the phase conditions of the previous paragraph. This means though that the selected frequencies will probably not be equidistant as shown in FIG. 5. However the general smooth slope of all noise parameters encourages the assumption of valid linear interpolation, even if the frequency steps are random. The second reflection factor contour (TUNER STATE T2) is created by the same horizontal probe position and only a slightly withdrawn probe, a motor movement that takes only a fraction of a second. In other words the overall tuning time, once the tuning probe is properly horizontally set, is the few tenths of a second required for the small vertical $\Delta Y$ movement.

The noise parameter determination is divided in two major steps: in the first step noise figure data of the DUT are collected using previously disclosed methods (see ref. 4), wherein typically between 7 and 11 source admittance points are used. In our case the number M of measured data is determined by the number N of frequency steps: M=2*(N+1). After this step all measured data are temporarily saved for all frequencies measured at randomly selected source admittance points. In a second major step the data are retrieved from temporary memory and processed. This process comprises two search steps and two extraction algorithms. The search occurs for each frequency individually: the smallest measured noise figure (Fo) of each set of data at the specific frequency FREQ.J is selected and the associated reflection factor Γs.o or admittance (Ys.o) identified. This corresponds to a reflection factor Γs.o=|Γs.o|*exp(j$\Phi$s.o)=(Yo-Ys.o)/(Ys.o+Yo), whereby Yo=20 mS; subsequently a number of typically 10 to 15 reflection factor states are identified among the measured data in the immediate neighborhood of Γo. Using these data the linearizing extraction method (see ref. 6) and extraction method for the four noise parameters of the DUT using Singular Value Decomposition (SVD) methods (see ref. 7) are used to determine the four noise parameters.

Figure 3:
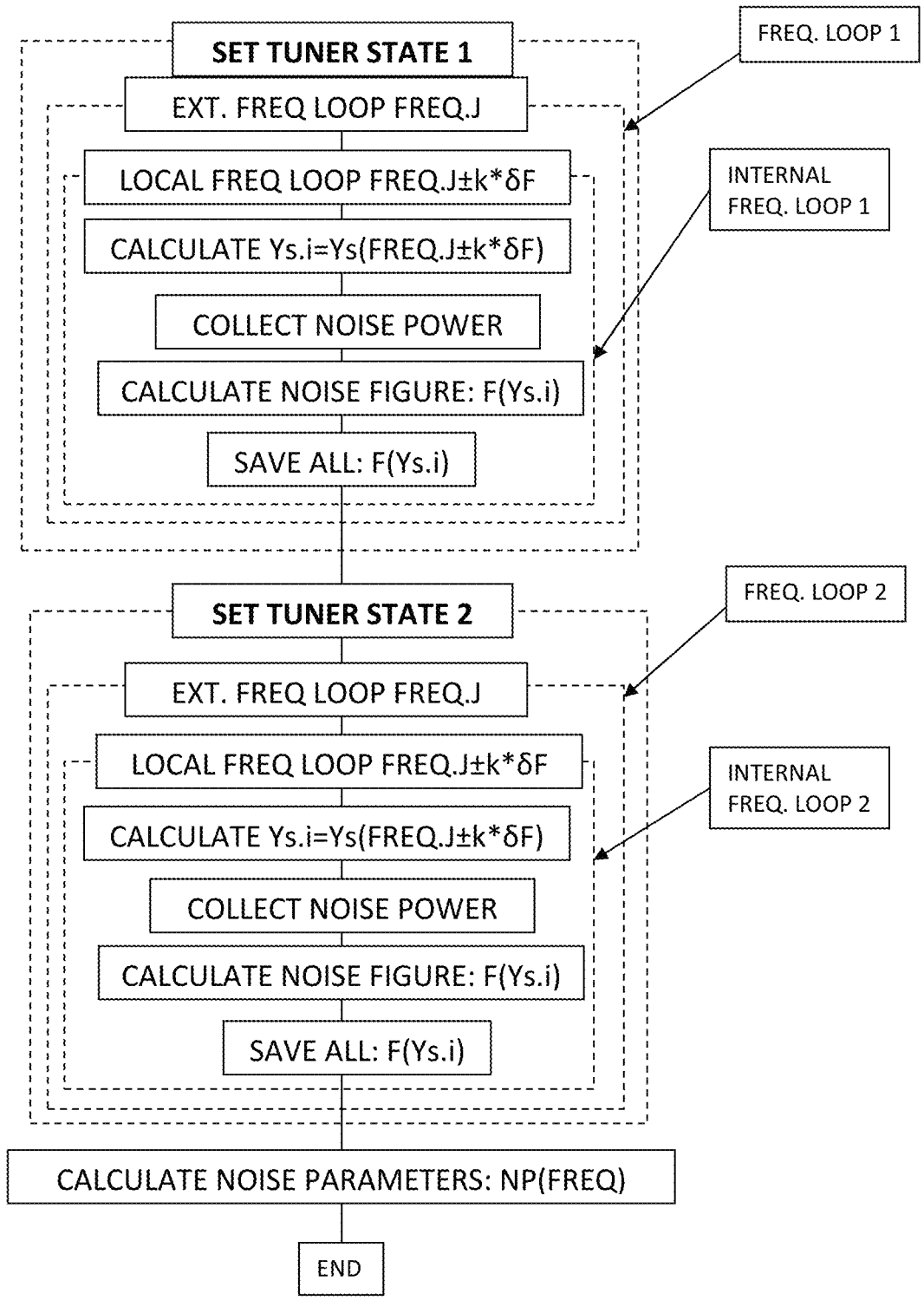
FIG. 3 depicts the flow chart of the method.

The extracted noise parameters include the minimum noise figure Fmin, the equivalent noise resistance Rn and the optimum reflection factor Γopt or Yopt including its amplitude |Γopt| and phase $\Phi$opt or real and imaginary part: Yopt=Gopt+jBopt. Since all admittance states used in this extraction are close and surrounding the smallest measured value Fo there exist high confidence for the extracted values Fmin and Yopt (or Γopt). All four noise parameters, Fmin, Rn, Yopt=Gopt+jBopt, are calculated, but it is assumed, due to the hitherto analysis and experiments (FIG. 3) that measured values F(Γs.i) placed closest to the optimum will yield Fmin and Γopt with higher accuracy and consistency than Rn; the value of Rn is in certain doubt.

The set (cluster) of source reflection factors surrounding the reflection factor Γs.o=|Γs.o|*exp(j$\Phi$s.o) associated with the smallest measured noise figure Fo is chosen such that the reflection factors comprise values with amplitudes |Γs.i| around |Γs.o| and phases on both sides of $\Phi$s.o ($\Phi$s.i is both smaller and larger than $\Phi$s.o).

In a next step (and always for the same frequency) a set of source states on the opposite side of the Smith chart is pinpointed. Again a number of states are used and combined with the states around Fmin to a new round of linearizing extractions. The result of this second round of extractions yields a more reliable value for Rn, because the data contain enough information about values further away from the optimum (see ref. 9). The drawn lines among the data points in FIGS. 5 and 7 are mathematical averages around a center value.

In summary the invention introduces a new strategy for measuring noise figure and extracting the four noise parameters from measured noise figure data, which are fluctuating and associated with random errors. It cannot be assumed that all errors are purely random, since then a simple averaging over a large amount of data would be enough to clean up (average out) such errors. The four noise parameters constitute a noise behavior model of the DUT and as such each model parameter shall be determined where it is most sensitive to the measured inputs. This is made using randomly chosen tuner states in two Smith chart clusters, one around the optimum noise figure and one on the opposite region.

In short, this method swaps slow mechanical tuner movement with fast small frequency steps around a set of center frequencies to collect the required noise figure data as a function of source admittance.

In this invention we disclose a systematic noise parameter extraction method which allows sufficient accuracy with minimum tuner movement. The method does not apply to PIN diode solid state tuners (see ref. 10) because there the change of impedance with even small frequency steps is random and often abrupt. The selection of distinct source admittance data points for determining different noise parameters over a wide frequency range measured at small frequency intervals around each frequency point and the selection of valid points as well as the statistical extraction algorithms are new for this kind of application.

What I claim as my invention is:

1. A method for measuring four noise parameters of microwave devices using a test setup, the method comprising:
    a source impedance pattern generation process, and
    a noise parameter extraction procedure;
    wherein the test setup comprises a cascade of:
        a noise source, a slide screw impedance tuner having a horizontally and vertically movable tuning probe, a device under test (DUT) and a noise receiver;
    wherein the source impedance pattern generation process comprises generating source reflection factors (Γs) at a fixed horizontal position and two vertical positions of the movable tuning probe of the slide screw tuner by switching a measurement frequency F around a center frequency FREQ.J by K frequency steps $\delta$F: F=FREQ.J±K*$\delta$F, wherein K=1, 2, 3 ... N, resulting in the source reflection factors Γs(FREQ.J±K*$\delta$F);
    and wherein the noise parameter extraction procedure comprises
        measuring noise figure (NF) or noise power (NP) at a number 2N+1≥7 of the source reflection factors Γs(FREQ.J±K*$\delta$F) and applying least square error noise parameter extraction.

2. The method for measuring the four noise parameters of microwave devices of claim 1 wherein
    the slide screw impedance tuner of the test setup comprises:
    a slotted airline (slabline) with a test and an idle port, and
    at least one remotely controlled tuning probe insertable into a solid house, and movable horizontally along and vertically into the slabline.

3. The method for measuring the four noise parameters of microwave devices of claim 1 wherein
    the noise parameter extraction procedure comprises:
        measuring noise figures at two impedance tuner settings involving a single horizontal tuning probe position and two vertical tuning probe positions, one vertical tuning probe position creating a first reflection factor of 0.85, and a second vertical tuning probe position creating a second reflection factor of 0.5 at a DUT reference plane.

4. The method for measuring the four noise parameters of microwave devices of claim 3, wherein
the noise parameter extraction procedure comprises:
calculating a horizontal tuning probe position X and a frequency step δF to create a spread of phase Φs of a reflection factor Γs=|Γs|*exp(jΦs) at the DUT reference plane within a bandwidth FREQ.J±N*δF around the center frequency FREQ.J, whereby N has values between 3 and 6.

5. The method for measuring the four noise parameters of microwave devices of claim 3 comprising:
a) measuring noise figure data at a multitude of source reflection factors;
b) applying the least square error noise parameter extraction algorithm to the noise figure data acquired in step a) as follows:
i) using the noise figure data, measured at a cluster of source reflection factors in an area associated with a smallest measured noise figure, to determine a minimum noise figure Fmin and an optimum reflection factor Γopt, and
ii) adding to the cluster of source reflection factors of step i) the noise figure data, measured at the cluster of source reflection factors, to the cluster of source reflection factors of step i), to determine an equivalent noise resistance Rn.

\* \* \* \* \*